United States Patent
Shie et al.

(10) Patent No.: US 11,004,997 B2
(45) Date of Patent: May 11, 2021

(54) INFRARED THERMAL EMITTER

(71) Applicants: Godsmith Sensor Inc., Hsinchu (TW); Opto Tech Corporation, Hsinchu (TW)

(72) Inventors: Jin-Shown Shie, Hsinchu (TW); Yi-Chun Liao, Hsinchu (TW); Chieh-Yi Chen, Hsinchu (TW); Chung-Cheng Lin, Hsinchu (TW); Cheng-Wei Yang, Hsinchu (TW); Chi-Tseng Chang, Hsinchu (TW)

(73) Assignees: GODSMITH SENSOR INC., Hsinchu (TW); OPTO TECH CORPORATION, Hsinchu (TW)

( * ) Notice: Subject to any disclaimer, the term of this patent is extended or adjusted under 35 U.S.C. 154(b) by 91 days.

(21) Appl. No.: 16/539,423

(22) Filed: Aug. 13, 2019

(65) Prior Publication Data
US 2020/0083394 A1  Mar. 12, 2020

(30) Foreign Application Priority Data
Sep. 7, 2018 (TW) .................. 107131437

(51) Int. Cl.
*H01L 31/09* (2006.01)
*H04N 5/33* (2006.01)
*H01L 31/16* (2006.01)
*H01L 33/18* (2010.01)

(52) U.S. Cl.
CPC ............. *H01L 31/09* (2013.01); *H01L 31/16* (2013.01); *H04N 5/33* (2013.01); *H01L 33/18* (2013.01)

(58) Field of Classification Search
CPC ............................... H01L 31/16; H01L 31/09
See application file for complete search history.

(56) References Cited

U.S. PATENT DOCUMENTS

| | | | |
|---|---|---|---|
| 2011/0044026 A1 | 2/2011 | Deeben et al. | |
| 2016/0104696 A1* | 4/2016 | Laveigne | H01L 27/14649 257/88 |
| 2017/0243988 A1 | 8/2017 | Bower et al. | |

OTHER PUBLICATIONS

Yang et al. "A light down conversion infrared scene projector" Proc. SPIE 9677 (Oct. 8, 2015).*
Vincent T. Bly "Passive visible to infrared transducer for dynamic infrared image simulation" Optical Engineering vol. 27 No. 6 1079-1082 (1982).*
Zhou et al. "A self-suspended MEMS film convertor for dual-band infrared scene projection" Infrared Physics and Technology 105 (2020) 103231.*

(Continued)

*Primary Examiner* — Edwin C Gunberg
(74) *Attorney, Agent, or Firm* — Brinks Gilson & Lione (57) ABSTRACT

An infrared thermal emitter includes a substrate, a light-emitting unit and an infrared-emitting unit. The light-emitting unit is disposed on the substrate in a laminating direction and has a light-exiting surface away from the substrate. The infrared-emitting unit is disposed on the substrate in the laminating direction to cover the light-emitting unit and includes a layered structure having a light-absorbing layer that is aligned with the light-emitting unit in the laminating direction. The light-absorbing layer absorbs light emitted from the light-emitting unit so as to be heated up and to generate infrared radiation.

13 Claims, 7 Drawing Sheets

(56) References Cited

OTHER PUBLICATIONS

Li et al. "A Robust Infrared Transducer of an Ultra-Large-Scale Array" Sensors 2020, 20, 6807.*
Search Report appended to an Office Action, which was issued to Taiwanese counterpart application No. 107131437 by the TIPO dated May 6, 2019, 2 pages.

* cited by examiner

INFRARED THERMAL EMITTER

CROSS-REFERENCE TO RELATED APPLICATION

This application claims priority of Taiwanese Patent Application No. 107131437, filed on Sep. 7, 2018.

FIELD

The disclosure relates to an infrared thermal emitter, and more particularly to an infrared thermal emitter including an infrared-emitting unit that absorbs light emitted from a light-emitting unit to generate infrared radiation.

BACKGROUND

An electro-thermal chip-type infrared-emitting device that uses electrical energy for heating internal portion thereof to generate infrared radiation is widely applied in non-dispersive infrared (NDIR) gas sensors, as disclosed by U.S. Pat. No. 7,989,821 B2, U.S. Patent Application Publication No. 2012/0267532 A1 and U.S. Pat. No. 8,575,578 B1.

U.S. Pat. No. 7,989,821 B2 discloses an infrared source that includes an epitaxial membrane having an electrical conductive layer that is made of doped polysilicon, and an emitter part that is connected to the epitaxial membrane and that is made of polysilicon doped with boron or phosphorus. The electrical conductive layer provides electrical energy for heating the emitter part so as to generate infrared radiation.

U.S. Patent Application Publication No. 2012/0267532 A1 discloses an infrared sensor made by a compatible complementary metal-oxide semiconductor (CMOS) technology. The infrared sensor includes a silicon substrate and a tungsten resistive heater that is integrally formed and buried in an oxide layer, a dielectric layer, and a passivation layer of a membrane on the silicon substrate. The tungsten resistive heater provides electrical energy for heating the membrane so as to generate infrared radiation.

U.S. Pat. No. 8,575,578 B1 discloses a chip-scale infrared emitter package that includes a membrane disposed on a base, and an electric resistor that is made from a metal and that is disposed on the membrane. The electric resistor provides electrical energy for heating the membrane so as to generate infrared radiation.

However, for the aforementioned electro-thermal chip-type infrared-emitting devices, the heating provided by the electrical energy consumes a great amount of time and is costly. In addition, the electro-thermal chip-type infrared-emitting device of U.S. Patent Application Publication No. 2012/0267532 A1 and U.S. Pat. No. 8,755,778 B1 includes electrical conductor made from metal for transmitting electrical energy to infrared emitter made of non-metallic material. Since the electro-thermal chip-type infrared-emitting device is usually operated at a relatively high temperature, the electrical conductor and the infrared emitter in contact with one another might generate excessive thermal stress due to difference in thermal expansion coefficients thereof. Therefore, the electro-thermal chip-type infrared-emitting devices are liable to structural damage following long-term operation at high temperature, which may reduce its overall operational efficiency and service life.

SUMMARY

Therefore, an object of the disclosure is to provide an infrared thermal emitter that can alleviate at least one of the drawbacks of the prior art.

According to the disclosure, an infrared thermal emitter includes a substrate, a light-emitting unit and an infrared-emitting unit. The light-emitting unit is disposed on the substrate in a laminating direction and has a light-exiting surface away from the substrate. The infrared-emitting unit is disposed on the substrate in the laminating direction to cover the light-emitting unit and includes a layered structure having a light-absorbing layer that is aligned with the light-emitting unit in the laminating direction. The light-absorbing layer absorbs light emitted from the light-exiting surface of the light-emitting unit so as to be heated up and to generate infrared radiation.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Before the disclosure is described in greater detail, it should be noted that where considered appropriate, reference numerals or terminal portions of reference numerals have been repeated among the figures to indicate corresponding or analogous elements, which may optionally have similar characteristics.

Figure 1:
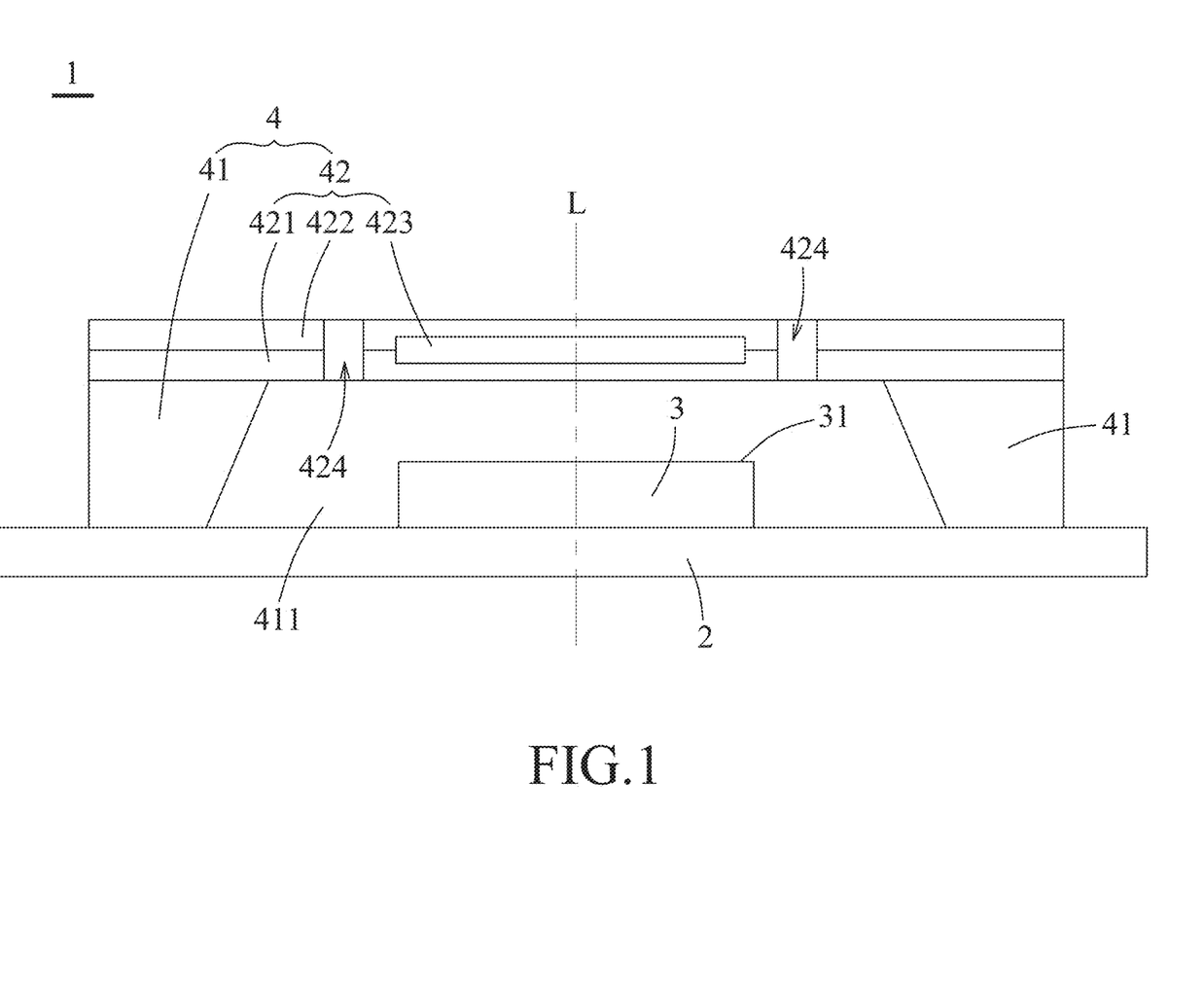
FIG. 1 is a schematic sectional view illustrating an embodiment of an infrared thermal emitter according to the present disclosure.
Figure 2:
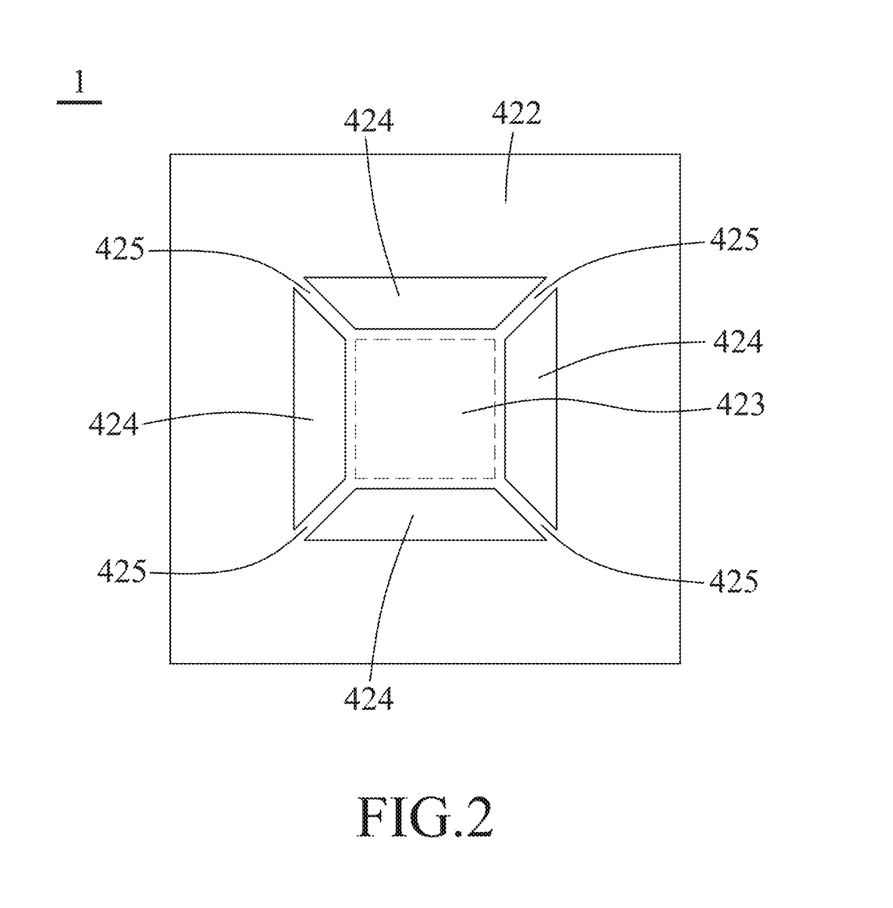
FIG. 2 is a top view of the embodiment.

Referring to FIGS. 1 and 2, an embodiment of an infrared thermal emitter 1 of this disclosure includes a substrate 2, a light-emitting unit 3 and an infrared-emitting unit 4.

The light-emitting unit 3 and the infrared-emitting unit 4 are disposed on the substrate 2. Example of the substrate 2 may include a circuit board such as a ceramic circuit board or a printed circuit board (PCB). The substrate 2 may be used as an intermediate for electrically connecting the light-emitting unit 3 to an external control device or other cooperating device (not shown).

The light-emitting unit 3 is electrically connected to and is disposed on the substrate 2 in a laminating direction (L), and has a light-exiting surface 31 away from the substrate 2. In certain embodiments, the light-emitting unit 3 is a semiconductor light-emitting element such as a light-emitting diode (LED) die or a laser diode die. In this embodiment, the light-emitting unit 3 is a light-emitting diode (LED) die. The light-emitting unit 3 has superior characteristics such as small volume, high luminous efficiency, good service life, and fast switching response time, and thus is an excellent light excitation source for heating the infrared-emitting unit 4. In certain embodiments, the light-emitting unit 3 may be a flip-chip blue LED die having a side length of 800 to 1000 μm, a thickness of not more than 200 μm, and a peak wavelength of 0.44 μm, and the light-emitting unit 3 may be directly connected to the substrate 2 by solder bonding, and thus wire bonding may be omitted. Since the blue LED die has a stable performance and low manufacturing cost and is well-known to those skilled in the art, mass production of the infrared thermal emitter 1 may be achieved. In other embodiments, the light-emitting unit 3 is not limited to the blue LED die and other types of light-emitting elements may be used according to practical requirements.

The infrared-emitting unit 4 is disposed on the substrate 2 in the laminating direction (L) to cover the light-emitting unit 3 and includes a base 41 and a layered structure 42.

The base 41 is disposed on the substrate 2, surrounds the light-emitting unit 3, and has a cavity 411 in which the light-emitting unit 3 is centrally disposed. The base 41 protects the light-emitting unit 3 and provides support to the layered structure 42 such that the layered structure 42 is disposed above and spaced apart from the light-exiting surface 31 of the light-emitting unit 3. An example of the base 41 may include, but is not limited to, a silicon wafer having a thickness of 300 μm. In an exemplary embodiment, a surface of the silicon wafer that is to be connected to the substrate 2 may be subjected to anisotropic wet etching so as to form the cavity 411 having an inclined inner wall that is tapered upwardly (see FIG. 1). The use of anisotropic wet etching on the silicon wafer to form the cavity 411 has several advantages, including a short time period, inexpensive, and is compatible with existing semiconductor process technologies. In certain embodiments, the base 41 may be subjected to dry etching so as to form the cavity 411 having a vertically straight inner wall according to actual requirements, and is not limited to using the silicon wafer, and thus formation thereof is not limited to the aforesaid.

The layered structure 42 is connected to the base 41 so as to cover the cavity 411 and the light-emitting unit 3. The layered structure 42 includes a first layer 421, a second layer 422 and a light-absorbing layer 423. The first and second layers 421, 422 stacked on each other and disposed on the base 41 may be used as etch stop layers when the base 41 is etched, and for protecting the light-absorbing layer 423. Examples of a material suitable for making each of the first layer 421 and the second layer 422 include, but are not limited to, silicon nitride, silicon carbide, gallium nitride, zirconium oxide, magnesium oxide, and combinations thereof. The light-absorbing layer 423 is sandwiched between the first and second layers 421, 422 and is disposed immediately adjacent to the light-exiting surface 31 of the light-emitting unit 3, such that the light-absorbing layer 423 is aligned with the light-emitting unit 3 in the laminating direction (L) for absorbing light emitted from the light-exiting surface 31 of the light-emitting unit 3 so as to be heated up and to generate infrared radiation. In certain embodiments, the thus generated infrared radiation has a wavelength ranging from 3 to 25 μm. For example, the thus generated infrared radiation may be thermal infrared radiation that includes mid-wavelength infrared radiation and long-wavelength infrared radiation. In this embodiment, the light-absorbing layer 423 has a bottom surface with a dimension which is substantially equals to that of the light-exiting surface 31 of the light-emitting unit 3. Examples of a material suitable for making the light-absorbing layer 423 include, but are not limited to, polycrystalline silicon, silicon carbide, and gallium nitride. In certain embodiments, the layered structure 42 further has at least one through hole 424 that penetrates the first and second layers 421, 422 and that is spaced apart from the light-absorbing layer 423 for reducing heat transfer from the light-absorbing layer 423. In this embodiment, the layered structure 42 has a plurality of the through holes 424 that penetrate the first and second layers 421, 422 and that surround the light-absorbing layer 423. A portion of the first and second layers 421, 422 located among the through holes 424 forms a plurality of linkers 425 such that the light-absorbing layer 423 and another portion of the first and second layers 421, 422 covering the light-absorbing layer 423 are suspended above the light-emitting unit 3. In certain embodiments, the light emitted from the light-exiting surface 31 of the light-emitting unit 3 has a peak wavelength that ranges from 0.40 μm to 0.52 μm, and each of the first and second layers 421, 422 has a thickness that equals to a quarter of the peak wavelength of the light emitted therefrom, allowing an excellent transmission of the light emitted from the light-emitting unit 3 to the first layer 421 so as to be absorbed by the light-absorbing layer 423, thereby effectively saving energy. In an exemplary embodiment, the first and second layers 421, 422 and the light-absorbing layer 423 are deposited by low-pressure chemical vapor deposition (LPCVD), in which each of the first and second layers 421, 422 having a thickness of 0.16 μm is made from silicon nitride, and the light-absorbing layer 423 is made from polycrystalline silicon. Since thermal expansion coefficients of polycrystalline silicon and silicon nitride are approximately the same, excessive thermal stress due to mismatch of the thermal expansion coefficients will not be easily generated in the first and second layers 421, 422 and the light-absorbing layer 423 during operation under a high temperature, so as to prevent the layered structure 42 from being damaged. In addition, since polycrystalline silicon and silicon nitride have high melting points (i.e., the melting points for polycrystalline silicon and silicon nitride are 1414° C. and 1900° C., respectively), the layered structure 42 is suitable to be operated at a high temperature. In another exemplary embodiment, the light-absorbing layer 423 has a thickness of not less than 0.7 μm, which allows the light-absorbing layer 423 to absorb the light emitted from the light-emitting unit 3 to the utmost extent, but is not limited thereto.

Figure 3:
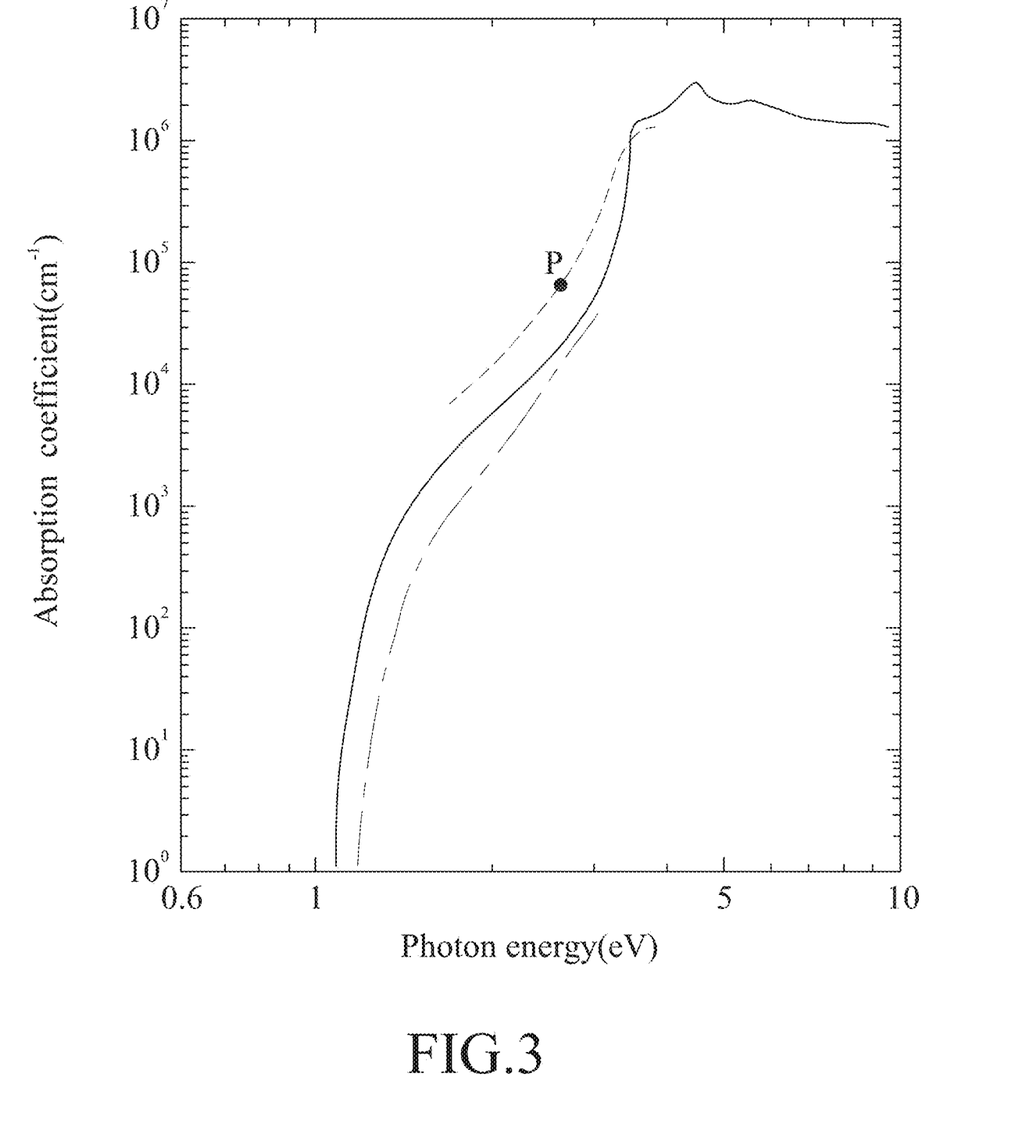
FIG. 3 is a graph illustrating relationship between photon energy of a light emitted from a light-emitting unit of the embodiment and absorption coefficient of a light-absorbing layer of the embodiment at different temperatures.

Referring to FIG. 3, in combination with FIG. 1, a preference for the thickness of the light-absorbing layer 423 to be not less than 0.7 μm as mentioned in the foregoing is explained by a graph that illustrates relationship between photon energy of the light emitted from the light-emitting unit 3 and absorption coefficient of the light-absorbing layer 423 at different temperatures, in which the two-dashed, solid and dashed curves respectively represents temperatures of 77 K, 300 K and 676 K. For example, the photon energy of a blue light emitted from the light-emitting unit 3 having a peak wavelength of 0.44 μm is calculated according to the following equation: $E = h \times C/\lambda$, wherein E, h, C and $\lambda$ respectively represents photon energy, Planck constant, light speed, and peak wavelength, and thus, for a photon with a peak wavelength of 0.44 μm, the photon energy (E) is $1.24/0.44 \approx 2.8$ electronvolt (eV), and the corresponding absorption coefficient for the photon is $6 \times 10^4 (cm^{-1})$, which is based on point P of the dashed curve that represents the temperature of 676 K. Furthermore, in accordance to Beer-Lambert law: $I(x) = I_0 x e^{-\alpha x}$, where x represents a thickness of a layer which an incident light is transmitted, $I_0$ represents initial light intensity of the incident light, $I(x)$ represents a light intensity of the incident light after being transmitted from the layer having a thickness of x, and $\alpha$ represents absorption coefficient, when the thickness of the light-absorbing layer 423 is exemplified to be 0.7 µm and the absorption coefficient is $6 \times 10^4 (\text{cm}^{-1})$ as described in the foregoing, an incident light having a peak wavelength of 0.44 µm and transmitting through the light-absorbing layer 423 that has a thickness of 0.7 µm at a temperature of 676 K, will have a calculated light intensity, $I(0.7)$ of approximately $0.015\ I_0$. In other words, at the temperature of 676 K (i.e., 403° C.), about 98.5% of the blue light (i.e., incident light) emitted by the light-emitting unit 3 and having a peak wavelength of 0.44 µm will be absorbed by the light-absorbing layer 423 that has a thickness of 0.7 µm when transmitting therethrough. If the thickness of the light-absorbing layer 423 increases, the absorption coefficient thereof increases accordingly. Therefore, the peak wavelength of the light emitted from the light-emitting unit 3 (i.e., incident light), and the material and thickness of the light-absorbing layer 423 are important factors that affects the absorption coefficient of the light-absorbing layer 423, which in turn may determine the infrared radiation power of the infrared thermal emitter 1. In addition, as shown by the three curves representing different temperatures in FIG. 3, for the same photon energy (i.e., having the same peak wavelength of incident light), the absorption coefficient increases correspondingly with the temperature. Therefore, when the light-absorbing layer 423 absorbs a higher proportion of incident light at a temperature higher than 676 K, the infrared thermal emitter 1 can emit infrared radiation with higher power, and thus energy conversion efficiency can be improved. However, the peak wavelength of the light emitted from the light-emitting unit 3, and the material and thickness of light-absorbing layer 423 may be adjusted according to actual requirements, and are not limited to the aforesaid.

Figure 4:
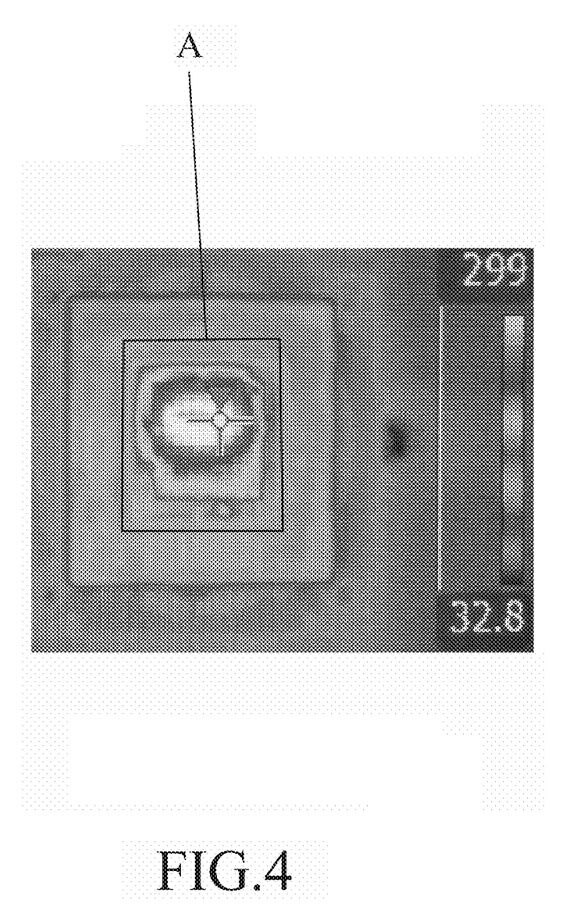
FIG. 4 is a thermal image illustrating distribution of surface temperature of the embodiment in a state of use.

Referring to FIG. 4, in combination with FIG. 1, a thermal image of a top view angle of the infrared thermal emitter 1 in a state of use shows that a temperature thereof ranges from 32.8° C. to 299° C., and that an area (A) is substantially the area representing the light-absorbing layer 423, in which the highest temperature measured is 325° C. Other areas not representing the light-absorbing layer 423 have relatively lower temperatures, indicating that majority of the light emitted from the light-emitting unit 3 is absorbed by the light-absorbing layer 423, so as to be heated up in order to generate infrared radiation.

Figure 5:
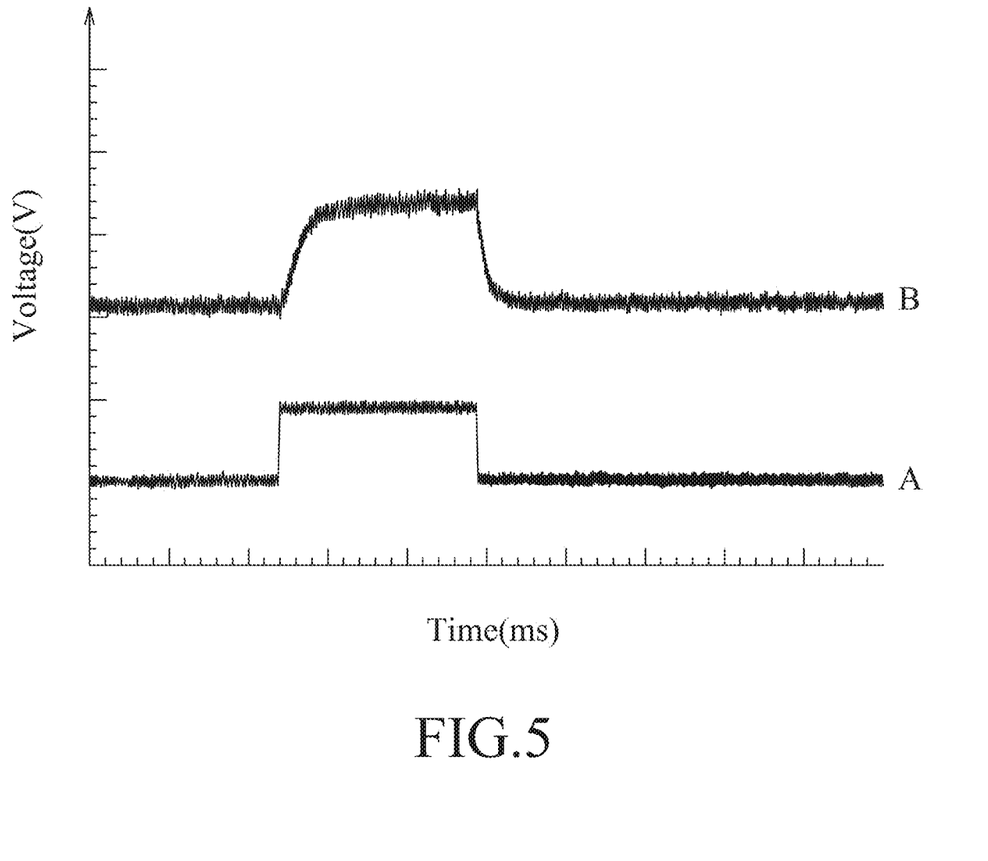
FIG. 5 is a graph illustrating square wave signal demonstrating switching response time of the embodiment.

Referring to FIG. 5, in combination with FIG. 1, curve A represents a square wave signal of an input current supplied to the infrared thermal emitter 1 by an external power circuit (not shown), in which the input current of 0.6 amps is supplied to the infrared thermal emitter 1 for 50 msec, and curve B represents a square wave signal of infrared radiation emitted by the infrared thermal emitter 1 and detected by a thermo-electrically-cooled detector, in which the square wave signal lasts for about 50 msec, and has a rise time of 8 msec and a fall time of 3 msec. This result shows that the infrared thermal emitter 1 is capable of emitting the infrared radiation within a short response time after being supplied with input current, and immediately stops emitting the infrared radiation within a short response time when the input current is cut off, which indicate that the temperature of the light-absorbing layer 423 can be increased immediately after absorbing light emitted by the light-emitting unit 3 and decreased immediately after discontinuation of the light supplied by the light-emitting unit 3, thereby effectively controlling emission of the infrared radiation by the infrared thermal emitter 1.

Figure 6:
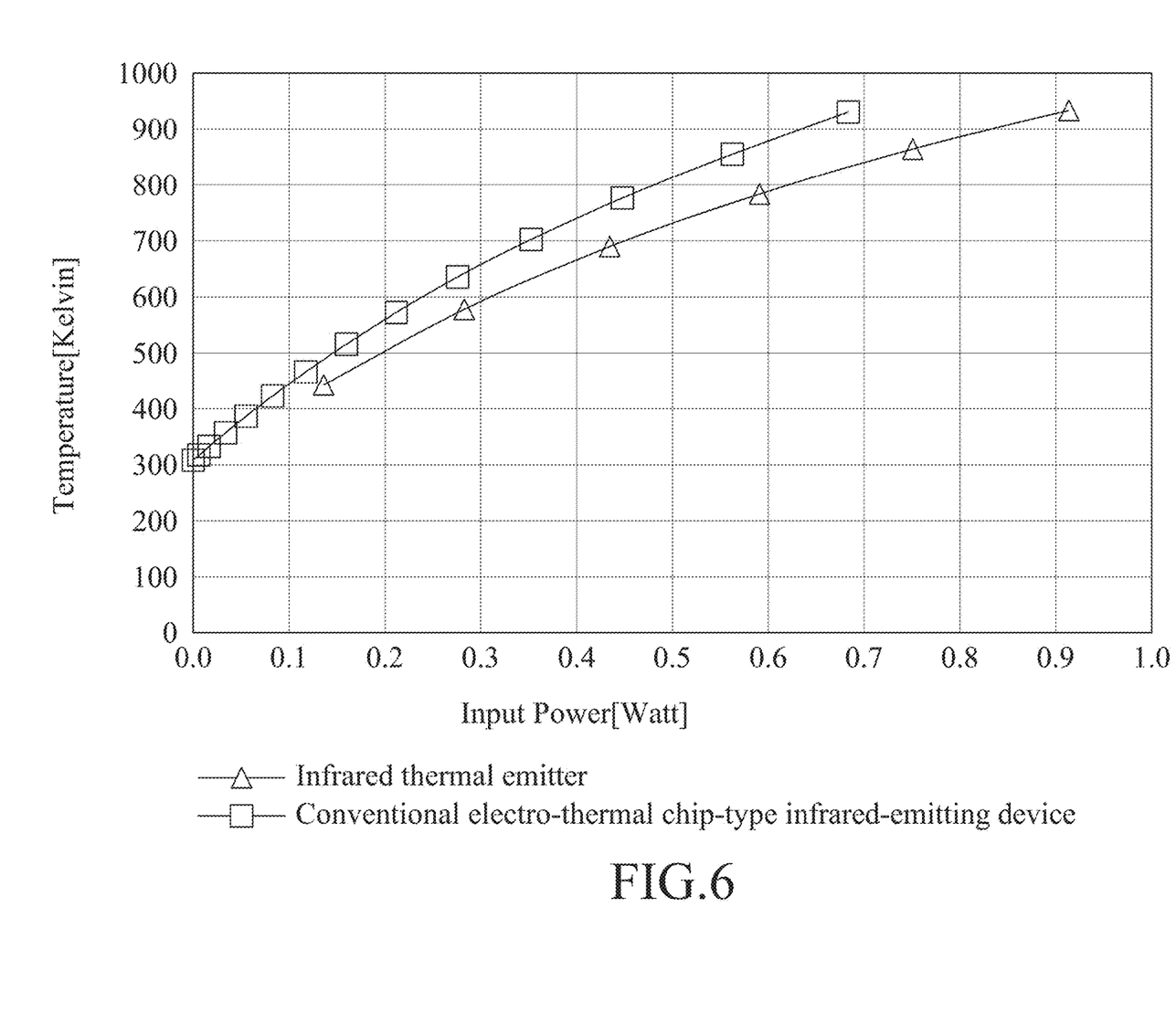
FIG. 6 is a graph comparing temperature of the light-absorbing layer of the embodiment and that of a resistor of a conventional resistant heater.

FIG. 6, in combination with FIG. 1, show a comparison of the temperatures of the light-absorbing layers 423 of the infrared thermal emitters 1 and the temperature of a conventional electro-thermal chip-type infrared-emitting device at different input powers. The result shows that, at the same input power, the light-absorbing layer 423 of the infrared thermal emitter 1 of this disclosure is capable of being heated to a temperature close to that of the conventional electro-thermal chip-type infrared-emitting device, while having a fast switching response time as described above.

Figure 7:
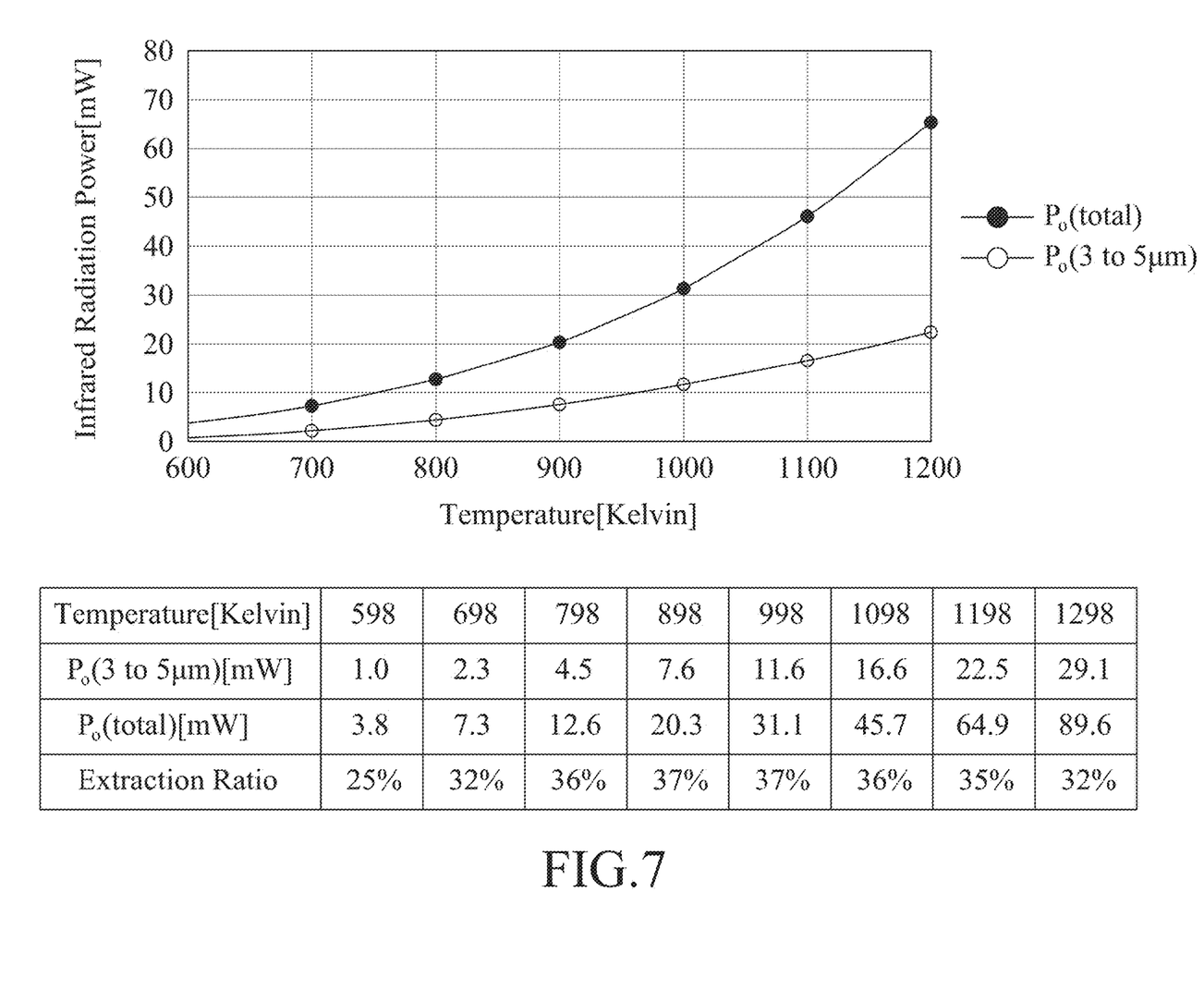
FIG. 7 is a graph illustrating relationship between power of the infrared radiation of the embodiment and temperature of the light-absorbing layer.

FIG. 7, in combination with FIG. 1, shows the power of infrared radiation of the infrared thermal emitter 1 at different temperatures of the light-absorbing layer 423 after heating, in which $P_O$ (total) represents the power of an entire wavelength spectrum of the infrared radiation of the infrared thermal emitter 1, and $P_O$ (3 to 5 µm) represents the power of the infrared radiation of the infrared thermal emitter 1 having a wavelength ranging from 3 um to 5 um, which is widely used in certain applications, such as in gas detector. The extraction ratio is defined as the ratio of $P_O$ (3 to 5 µm) to $P_O$ (total). As shown in the table of FIG. 7, the extraction ratio of the infrared thermal emitter 1 is rather constant when the light-absorbing layer 423 has a temperature that ranges from 598 K to 1298 K, which is desirable for various applications.

In summary, the infrared-radiation device 1 of the present disclosure, by virtue of the light-absorbing layer 423 of the layered structure 42 being disposed immediately adjacent to the light-exiting portion 31 of the light-emitting unit 3 through alignment in the laminating direction (L), the light-absorbing layer 423 can absorb most of the light emitted by the light-emitting unit 3 so as to be heated up and to generate infrared radiation effectively. In addition, the aforesaid material and thickness of the layered structure 42 allows the light-absorbing layer 423 to be operated at a high temperature so that the energy conversion efficiency can be improved. Furthermore, since the thermal expansion coefficients of the first and second layers 421, 422 and the light-absorbing layer 423 match with one another, excessive thermal stress will not be easily generated in the layered structure 42 and thus, the service life and reliability of the infrared thermal emitter 1 can be effectively improved. Moreover, the light-emitting unit 3 which is exemplified by a semiconductor light-emitting element, such as a light-emitting diode (LED) die or a laser diode die, has a small size and fast switching response time. Similarly, the layered structure 42, particularly the light-absorbing layer 423, has a small surface area and size, which allows a short response time thereof with regard to the temperature rising when absorbing light and the temperature falling after discontinuation of the light supply. Therefore, the infrared thermal emitter 1 of the present disclosure is miniaturized and has a fast switching response time, which allows the infrared radiation to change its state at a high frequency, so as to meet various use requirements.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. An infrared thermal emitter, comprising:
    a substrate;
    a light-emitting unit that is disposed on said substrate in a laminating direction and has a light-exiting surface away from said substrate; and
    an infrared-emitting unit that is disposed on said substrate in the laminating direction to cover said light-emitting unit and includes a layered structure having a light-absorbing layer, said light-absorbing layer being aligned with said light-emitting unit in the laminating direction for absorbing light emitted from said light-exiting surface of said light-emitting unit so as to be heated up and to generate infrared radiation.

2. The infrared thermal emitter as claimed in claim 1, wherein said infrared-emitting unit further includes a base that is disposed on said substrate and that has a cavity in which said light-emitting unit is disposed, said layered structure being disposed on said base and covering said cavity and said light-emitting unit, said layered structure further including a first layer and a second layer, said light-absorbing layer being sandwiched between said first layer and said second layer.

3. The infrared thermal emitter as claimed in claim 2, wherein said light-absorbing layer is made of a material selected from the group consisting of polycrystalline silicon, silicon carbide, and gallium nitride.

4. The infrared thermal emitter as claimed in claim 3, wherein each of said first layer and said second layer is made of a material selected from the group consisting of silicon nitride, silicon carbide, gallium nitride, zirconium oxide, and magnesium oxide.

5. The infrared thermal emitter as claimed in claim 2, wherein said layered structure further has at least one through hole that penetrates said first layer and said second layer and that is spaced apart from said light-absorbing layer for reducing heat transfer from said light-absorbing layer.

6. The infrared thermal emitter as claimed in claim 5, wherein said layered structure has a plurality of said through holes that penetrate said first layer and said second layer and that surround said light-absorbing layer.

7. The infrared thermal emitter as claimed in claim 1, wherein said light-absorbing layer has a thickness of not less than 0.7 µm.

8. The infrared thermal emitter as claimed in claim 1, wherein said light-emitting unit is a light-emitting diode die.

9. The infrared thermal emitter as claimed in claim 1, wherein said light-emitting unit is a laser diode die.

10. The infrared thermal emitter as claimed in claim 1, wherein said light-absorbing layer is made of a material selected from the group consisting of polycrystalline silicon, silicon carbide, and gallium nitride.

11. The infrared thermal emitter as claimed in claim 1, wherein the light emitted from said light-exiting surface of said light-emitting unit has a peak wavelength that ranges from 0.40 µm to 0.52 µm.

12. The infrared thermal emitter as claimed in claim 1, wherein said light-absorbing layer of said layered structure is disposed immediately adjacent to said light-exiting portion of said light-emitting unit.

13. The infrared thermal emitter as claimed in claim 2, wherein each of said first layer and said second layer has a thickness that equals to a quarter of a peak wavelength of the light emitted from said light-exiting surface of said light-emitting unit.

* * * * *